United States Patent
Yano et al.

[11] Patent Number: 5,965,946
[45] Date of Patent: Oct. 12, 1999

[54] PACKAGE HAVING AU LAYER SEMICONDUCTOR DEVICE HAVING AU LAYER

[75] Inventors: Akihiro Yano; Yuji Kondo, both of Tokyo, Japan

[73] Assignee: NEC Corporation, Tokyo, Japan

[21] Appl. No.: 08/824,408

[22] Filed: Mar. 26, 1997

[30] Foreign Application Priority Data

Mar. 27, 1996 [JP] Japan ................................. 8-072667

[51] Int. Cl.⁶ .................................................. H01L 23/48
[52] U.S. Cl. ........................ 257/783; 257/782; 257/751
[58] Field of Search ........................... 257/99, 703, 751, 257/753, 763, 766, 782, 783

[56] References Cited

U.S. PATENT DOCUMENTS

| | | | |
|---|---|---|---|
| 3,551,997 | 1/1971 | Etter | 257/763 |
| 3,982,908 | 9/1976 | Arnold | 257/766 |
| 4,068,022 | 1/1978 | Glick | 257/766 |
| 4,480,261 | 10/1984 | Hattori et al. | 257/753 |
| 4,757,934 | 7/1988 | Greenstein | 257/782 |
| 4,772,935 | 9/1988 | Lawler et al. | 257/751 |
| 4,835,593 | 5/1989 | Arnold et al. | 257/753 |
| 4,935,805 | 6/1990 | Calviello et al. | 257/751 |
| 5,047,832 | 9/1991 | Tonai | 257/766 |
| 5,077,599 | 12/1991 | Yano et al. | 257/753 |
| 5,134,461 | 7/1992 | Yamakawa et al. | 257/766 |
| 5,559,817 | 9/1996 | Derkits, Jr. et al. | 257/753 |
| 5,635,764 | 6/1997 | Fujikawa et al. | 257/766 |

FOREIGN PATENT DOCUMENTS

| | | |
|---|---|---|
| 63-55433 | 4/1988 | Japan . |
| 5-166854 | 7/1993 | Japan . |
| 6-177135 | 6/1994 | Japan . |
| 7-263788 | 10/1995 | Japan . |

*Primary Examiner*—Nathan K. Kelley
*Attorney, Agent, or Firm*—Sughrue, Mion, Zinn, Macpeak & Seas, PLLC

[57] ABSTRACT

A method of mounting a semiconductor device first forms a barrier layer on one surface of an semiconductor substrate made of Si. Then, a first Au layer is formed on the barrier layer. Accordingly, a semiconductor device is provided. The barrier layer is formed of metal for preventing mutual diffusion of Si in the Si semiconductor substrate with Au in the first Au layer at a high temperature of 600° C. or higher. A step of acquiring a package substrate forms a metal coated layer on a base first and then forms a second Au layer on the surface of the metal coated layer. Then, the semiconductor device is placed on the package substrate with the first and second Au layers contacting with each other, and the semiconductor device and the package substrate are scrubbed against each other. Consequently, the first and second Au layers form Au—Au eutectic layer, thereby connect the semiconductor device to the package substrate.

9 Claims, 3 Drawing Sheets

PACKAGE HAVING AU LAYER SEMICONDUCTOR DEVICE HAVING AU LAYER

BACKGROUND OF THE INVENTION

1. Field of the Invention

The present invention relates to a package having an Au layer, a semiconductor device having such an Au layer, and a method of mounting the semiconductor device, which can prevent a positional deviation between semiconductor devices and a package substrate even when exposed to a high temperature of 500° C. or above after the mounting of the semiconductor devices on the package substrate.

2. Description of the Related Art

The attachment of a device to the position of a die pad such as a lead frame for a ceramic package and a plastic shielded package is called "die bonding." This die bonding can allow a device to mechanically and electrically connected to a package substrate and can cause heat generated from the device to be easily discharged. In general, die bonding requires that ohmic connection as well as stable mechanical and chemical bonding should be provided at the junction between a package substrate and the back of a device.

Die bonding techniques or methods of mounting semiconductor devices on a package substrate mainly include resin adhesion, an Au—Si eutectic alloy techniques, a soldering technique and an Au—Au eutectic technique. Method of bonding semiconductor components using such die bonding and packages fabricated using such die bonding are disclosed in Unexamined Japanese Patent Publication No. Hei 6-177135 (hereinafter called "first prior art") and Unexamined Japanese Patent Publication No. Hei 7-263788 (hereinafter called "second prior art").

FIG. 1 is a side view showing method of bonding a semiconductor components according to the first prior art. First, a barrier layer 21 of tungsten or the like is selectively formed on the surface of a submount body 20. Next, nickel-tin alloy and tungsten are simultaneously sputtered on the barrier layer 21 to form an auxiliary layer 22. Then, a wet layer 23 of nickel-tin alloy is deposited on the auxiliary layer 22. Then, gold and tin are alternately vapor-deposited on the wet layer 23, thus forming a solder layer 24. It is preferable that the area of this solder layer 24 which is in contact with the wet layer 23 and the top surface of the solder layer 24 should be formed of gold.

A laser element 8 which is to be bonded to the submount body 20 has a laser chip 9 formed of semiconductor in a III–V group, and an ohmic contact layer 10 formed on the surface of the laser chip 9 which is bonded to the submount body 20. A titanium layer 11, a platinum layer 12 and a gold layer 13 are sequentially and selectively deposited on the surface of this ohmic contact layer 10.

In bonding the thus formed submount body 20 and laser element 8 together, the submount body 20 and the laser element 8 are placed with the gold layer 13 in contact with the solder layer 24, and force 15 is applied to both at a temperature of approximately 320 to 340° C.

In this first prior art, the barrier layer 21 is formed of W, Mo, Cr or Ru. This barrier layer 21 serves to prevent the melting temperature of the solder layer 24 to increase. Generally, when silicon is diffused into the solder layer 24 formed of gold and tin, from the substrate, the melting temperature of the solder layer 24 increases. Therefore the barrier layer 21 can prevent the diffusion of silicon into the solder layer 24 from the substrate, thereby preventing the melting temperature of the solder layer 24 from increasing.

FIG. 2 is a perspective view showing a semiconductor laser device according to the second prior art. First, Ni is vapor-deposited on the surface of a heat sink 36 to form a barrier layer 35. Next, a low-melting point solder layer 34 of In, Sn or their alloy is selectively formed on the barrier layer 35. A p-type electrode 33 is formed on one surface of a semiconductor laser element 31 and an n-type electrode 32 is formed on the other surface thereof. The heat sink 36 is then heated to approximately 200° C. to melt the low-melting point solder layer 34, after which the p-type electrode 33 formed on the semiconductor laser element 31 is pressed against the low-melting point solder layer 34. Thereafter, both are cooled down so that the semiconductor laser element 31 is bonded to the heat sink 36.

According to this second prior art, Ni, W and Mo are used for the barrier layer 35. This barrier layer 35 serves to prevent Cu in the heat sink 36 from being diffused into the semiconductor laser element 31. Without the barrier layer 35, Cu would be diffused into the semiconductor laser element 31, deteriorating the laser output.

As the integration of semiconductor devices and the packing density thereof become higher and higher recently, the precision on the order of micrometers is demanded of the mount positions of semiconductor devices on a package substrate and the distances between adjoining semiconductor devices. In the case where a package substrate and semiconductor devices mounted on this package substrate are exposed to a high temperature, as in the case where a field discharge type electron source is used in a CRT (Cathode-Ray Tube), a die bonding technique which is excellent in heat resistance is demanded.

Because the melting temperature of the solder layer 24 is normally less than 400° C. in the first prior art, however, the solder layer 24 is melted if the package is exposed to a temperature of over 400° C. As the barrier layer 21 prevents the melting temperature of the solder layer 24 from becoming higher, melting of the solder layer 24 becomes easier.

Likewise, the solder layer 34 is made of metal whose melting temperature is low, e.g., approximately 200° C., in the second prior art, so that the solder layer 34 is melted if the package is exposed to a temperature of over 400° C.

Further, the barrier layer 35 merely serves to prevent Cu in the heat sink 36 from being diffused into the semiconductor laser element 31, but does not improve the heat resistance of the junction.

According to the first and second prior arts, as apparent from the above, when a package fabricated by mounting semiconductor devices on a package substrate is exposed to a temperature of over, for example, 400° C., the junction is melted, the misalignment of the semiconductor devices to the package substrate is likely to occur. As the junction is less durable to a high temperature, therefore, it is difficult to set the mount positions of the semiconductor devices on the package substrate and the distances between adjoining semiconductor devices at a high accuracy.

The Au—Au eutectic technique is one die bonding technique which gives a high heat resistance to the junction between a package substrate and semiconductor devices and ensures a high precision of alignment of the semiconductor devices to the package substrate. This Au—Au eutectic technique will be discussed below.

According to the Au—Au eutectic technique, an Au film is formed on the back surface of an Si substrate of semiconductor devices and also on the top surface of a package substrate, the Si substrate and the package substrate are arranged with their Au films facing each other, and the semiconductor device and the package substrate are rubbed (scrubbed) against each other while applying a load on both Au films. Consequently, Au—Au eutectic layer is formed so that the semiconductor devices and the package substrate are connected together. There are two scrubbing methods: one is an ultrasonic scrubbing method which applies ultrasonic waves to both Au films so that the semiconductor devices and the package substrate are scrubbed against each other by the ultrasonic vibration, and the other is a pressure scrubbing method which vibrates both Au films while mechanically applying a load on the semiconductor devices and the package substrate.

In either way, because Au as an adhesive has a high melting point of 1064.43° C., once semiconductor devices are connected to a package substrate, no misalignment occurs at the junction even if the package is exposed to a high temperature. With the ultrasonic scrubbing method in use, as the amplitude of ultrasonic waves ranges from −1 μm to +1 μm, misalignment hardly occurs at the time of making the connection. In other words, the Au—Au eutectic technique ensures a high heat resistance and a high precision of alignment at the junction between a package substrate and semiconductor devices even under the atmosphere of a high temperature.

In the case where this Au—Au eutectic technique is used to connect a package substrate and semiconductor devices together, conventionally, a metal layer is formed on the surface of the Si substrate of the semiconductor devices which is mounted on the package substrate, and an Au layer is formed on the top surface of this metal layer to form Au—Au eutectic layer. The metal layer is a barrier metal to prevent diffusion between Au and Si, and is normally formed of Ti or the like.

When a package fabricated by mounting semiconductor devices on a package substrate by the Au—Au eutectic technique is exposed to a high temperature, another problem arises. With the package exposed to a temperature of, for example, 370° C. or higher, diffusion between Au and Si cannot be prevented even when the conventional barrier metal of, for example, Ti is formed on a semiconductor device.

The mutual diffusion of Au and Si provides the same structure as the one where an Au—Si eutectic alloy layer is formed. The melting point of the Au—Si eutectic alloy layer is 370° C., which is relatively low among those of eutectic alloys. When the mutual diffusion of Au and Si occurs at a high temperature of 370° C. or higher, the Au—Si eutectic alloy layer is melted so that the portion near the barrier metal becomes susceptible to a high temperature while the Au—Au eutectic layer oriented junction shows an excellent heat resistance. In other words, when a package fabricated by mounting semiconductor devices on a package substrate by the Au—Au eutectic technique is exposed to a high temperature, misalignment occurs near the barrier metal.

A description will now be given of the case where a field discharge type electron source is mounted on a package substrate using the Au—Au eutectic technique. In using a field discharge type electron source for a CRT, after the field discharge type electron source as a semiconductor device is mounted on a package substrate, this package substrate is exposed to a high temperature of about 400 to 500° C. in the step of sealing the resultant structure with glass as the CRT. In a later process of discharging air from the glass container (discharging step), the semiconductor device and the package substrate (package) are also exposed to a high temperature of about 400 to 550° C. As a result, the junction between the semiconductor device and the package substrate is also exposed to a high temperature.

Although the semiconductor device and the package substrate are connected together by the Au—Au eutectic technique, therefore, misalignment of the semiconductor device on the package substrate occurs near the barrier metal of Ti and the like. When the field discharge type electron source is used for the CRT, the misalignment of the semiconductor device on the package substrate results in irregular colors or color deviation caused by misconvergence.

If the misalignment of a semiconductor device on a package substrate in any other package becomes greater, the distance between the bonding pad of the semiconductor device and the bonding portion of the package substrate becomes longer, thus making it difficult to connect the semiconductor device and the package substrate together.

SUMMARY OF THE INVENTION

Accordingly, it is an object of the present invention to provide a package having an Au layer, a semiconductor device having such an Au layer, and a method of mounting this semiconductor device, which allows a semiconductor device to be mounted on a package substrate by an Au—Au eutectic technique that ensures a high heat resistance at the junction between the semiconductor device and the package substrate and very high positional precision between the semiconductor device and the package substrate, and which can prevent a positional deviation between the semiconductor device and the package substrate near barrier metal even when exposed to a high temperature.

A package having an Au layer according to this invention comprises a package substrate, at least one semiconductor device to be mounted on the package substrate and an Au layer for connecting the semiconductor device and the package substrate together. The package substrate has a base and a metal coated layer selectively formed on the surface of the base. The semiconductor device has a semiconductor substrate made of Si, and a barrier layer formed on one surface of the semiconductor substrate. The Au layer is provided between the barrier layer and the metal coated layer. The metal coated layer serves to enhance adhesion between the Au layer and the base and prevent Au in the Au layer from being diffused into the base. The barrier layer serves to prevent mutual diffusion of Si in the semiconductor substrate with Au in the Au layer at a temperature of 600° C. or higher.

This barrier layer may be formed of one of Mo, W and Cr. The metal of the barrier layer should preferably have a purity of 99.9% by weight or higher, and more preferably have a purity of 99.99% by weight or higher.

Further, the base may be made of one of ceramics, KOVAR (an alloy of Fe, Ni and Co) and iron-nickel alloy, and the metal coated layer may be formed of one of Ni and Cr.

A semiconductor device having an Au layer according to this invention comprises a semiconductor substrate made of Si, a barrier layer formed on one surface of the semiconductor substrate, and an Au layer formed on the barrier layer. This barrier layer serves to prevent mutual diffusion of Si in the semiconductor substrate with Au in the Au layer at a temperature of 600° C. or higher.

A method of mounting a semiconductor device having an Au layer according to this invention comprises the steps of forming a semiconductor device, acquiring a package substrate, connecting the semiconductor device to the package substrate. The semiconductor device forming step includes the steps of forming a barrier layer on one surface of an Si semiconductor substrate having a predetermined circuit, and forming a first Au layer on the barrier layer. This barrier layer serves to prevent mutual diffusion of Si in the semiconductor substrate with Au in the first Au layer at a temperature of 600° C. or higher. The package substrate acquiring step includes the steps of forming a metal coated layer on a base, and plating the metal coated layer with Au to form a second Au layer. The step of connecting the package substrate and the semiconductor device together includes a step of scrubbing the semiconductor device and the package substrate with the first Au layer and the second Au layer placed to contact each other, to form Au—Au eutectic layer between the semiconductor device and the package substrate, thereby connecting the semiconductor device to the package substrate.

The barrier layer may be formed by vapor deposition or sputtering. The Au—Au eutectic layer forming step may be a step of scrubbing the semiconductor device and the package substrate against each other while applying a load or an ultrasonic wave to one or both of the semiconductor device and the package substrate.

As the barrier layer which can prevent mutual diffusion of Si and Au is formed between the substrate of a semiconductor device and the Au layer according to this invention, an Si—Au eutectic layer having a low melting point is not formed even when a package acquired by mounting this semiconductor device on a package substrate is exposed to a high temperature, it is possible to prevent position deviation between the semiconductor device and the package substrate near the barrier layer. Since this semiconductor device is mounted on the package substrate by arranging the first Au layer of the semiconductor device so as to contact the second Au layer of the package substrate and scrubbing the semiconductor device and the package substrate layers against each other using an Au—Au eutectic technique, a positional deviation hardly occurs at the time of connecting the semiconductor device and the package substrate together. Furthermore, it is possible to acquire a package which has a high heat resistance at the junction and a portion near the barrier layer even after the connection of the semiconductor device to the package substrate.

DETAILED DESCRIPTION OF THE PREFERRED EMBODIMENTS

Figure 1:
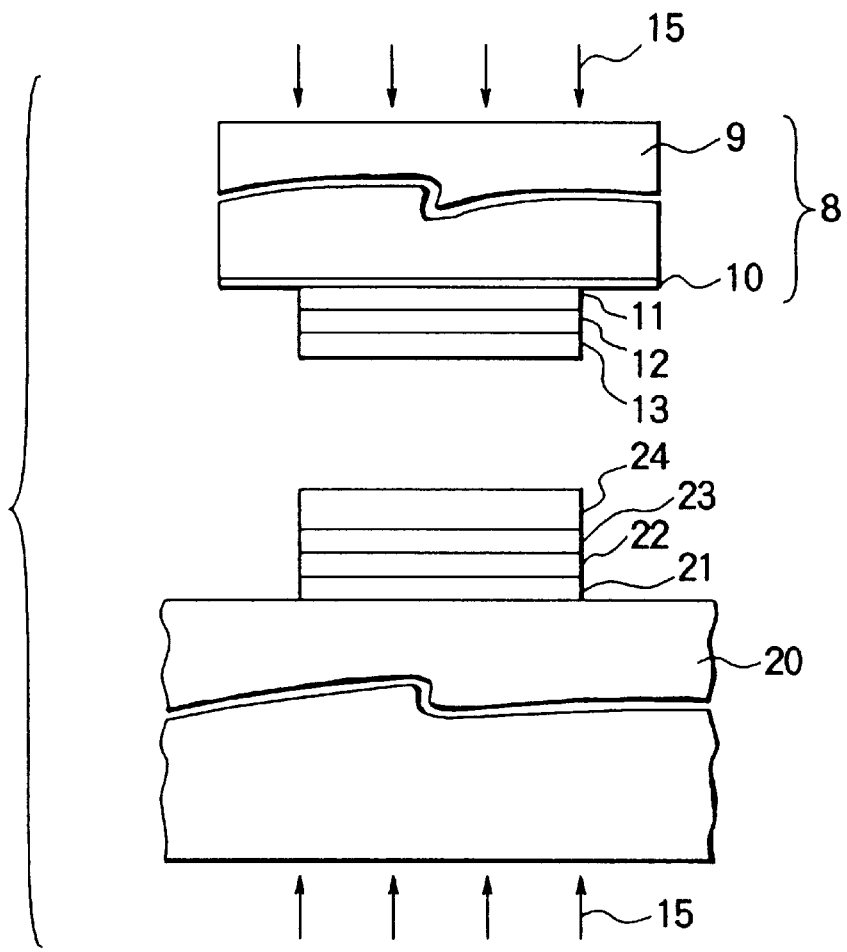
FIG. 1 is a side view showing method of bonding semiconductor components according to the first prior art.
Figure 2:
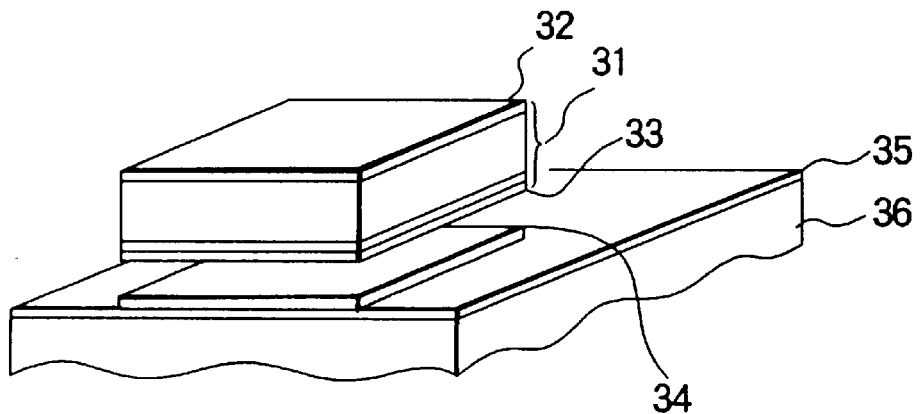
FIG. 2 is a perspective view showing a semiconductor laser device according to the second prior art.

A cathode ray tube (CRT) which uses a package as one embodiment of this invention will be described below. Particularly, this CRT uses a field discharge type electron source as an electron discharge source. That is, the package according to this embodiment of the invention has a semiconductor device which operates as a field discharge type electron source having field discharge type cold cathodes, gate electrodes and the like and which is mounted on a package substrate.

To begin with, the features of a field discharge type electron source and procedures of manufacturing a CRT will now be discussed.

A field discharge type electron source is a semiconductor device which has a matrix of a plurality of minute cold cathodes and gate electrodes associated with the cold cathodes. In this embodiment, the electron gun of a CRT is constituted by using such a field discharge type electron source. The field discharge type electron source Cusing cold cathodes has the following advantages as compared with the electron source used in conventional CRTs which uses hot cathodes.

First, the cathode current density can be made higher by enhancing the integration of the minute cold cathodes as compared with the case where hot cathodes are used. As the field discharge type electron source itself is fabricated by using the microprocessing technique for a semiconductor fabrication process, the minute cold cathodes and gate electrodes can be formed with a high integration and the distance between each cathode and the associated gate electrode can be shortened. This allows a large current to be controlled by a low drive voltage. Further, because the field discharge type electron source can be manufactured using a semiconductor fabrication technique, it has a high production precision and is suitable for mass production. What is more, the field discharge type electron source can be invoked instantaneously due to no heating necessary. The field discharge type electron source also has such a characteristic that discharged electrons have a narrow speed distribution.

In the case where the electron gun of a CRT is constituted by using a field discharge type electron source having those characteristics, field discharge type electron sources associated with the individual colors of R (Red), G (Green) and B (Blue) are mounted on a single package substrate. If the field discharge type electron sources associated with the individual colors R, G and B are deviated from predetermined positions, color irregularity or the like occurs. When the field discharge type electron source associated with R is deviated from its predetermined position, for example, not only the pixel associated with R which is intended to be lit but also those pixels near that pixel are lit. Further, an error in spatially converging three R, G and B electron beams causes color deviation on a shadow mask. A high precision is therefore demanded on the mount positions of the field discharge type electron sources on a package substrate.

In manufacturing a CRT, the individual field discharge type electron sources as semiconductor devices are mounted on a package substrate in the following manner. First, the field discharge type electron sources associated with the individual colors of R, G and B are mounted on a package substrate with the associated pads. Next, the gate electrodes of the semiconductor devices which constitute the respective field discharge type electron sources are connected (wire-bonded) to the pads. Then, an electron gun having the package with those semiconductor devices are mounted is assembled. Thereafter, the electron gun is sealed (sealing step) in the neck of a glass tube called funnel and air inside the funnel is discharged to provide a vacuum condition (discharging step), thus yielding a CRT.

To increase the precision of the mount positions of the field discharge type electron source on the package substrate in the fabrication of a CRT, care should be taken in three steps. First, it is desirable to increase the positioning precision of the mounting in the step of mounting the field discharge type electron sources associated with the individual colors of R, G and B on the package substrate. Secondly, because the package with semiconductor devices is exposed to a high temperature of approximately 400 to 500° C. in the sealing step, it is necessary to use a bonding technique which ensure an excellent heat resistance even after the mounting step and to select the proper device structure for mounting the individual field discharge type electron sources on the package substrate. Thirdly, since the package with semiconductor devices is likewise exposed to a high temperature of approximately 400 to 550° C. in the discharging step, it is also necessary to use a bonding technique which ensure an excellent heat resistance even after the mounting step and to select the proper device structure.

Figure 3:
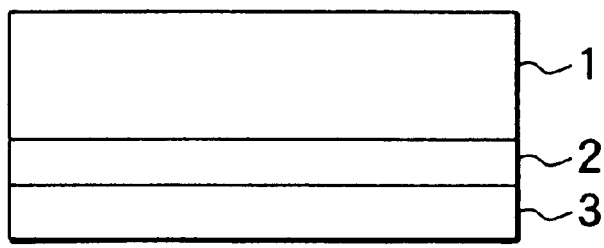
FIG. 3 is a side view illustrating one step in a method of manufacturing a CRT which uses a package according to one embodiment of this invention.
Figure 4:
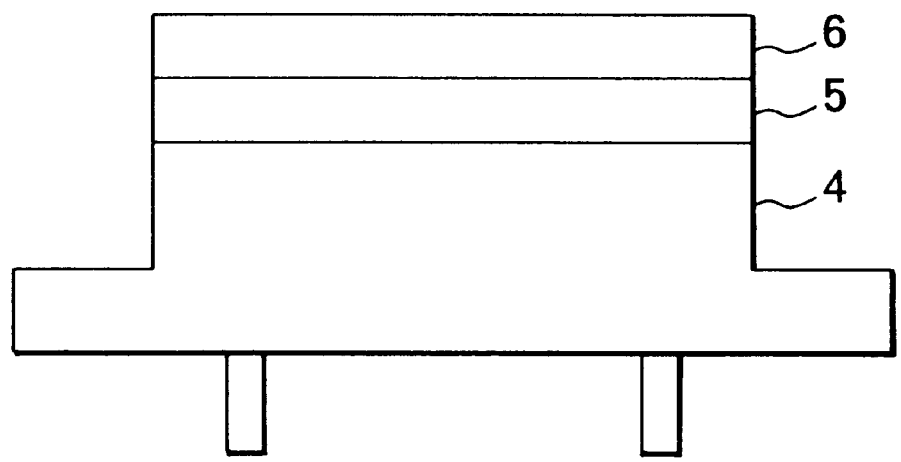
FIG. 4 is a side view showing the next step to what is shown in FIG. 3.
Figure 5:
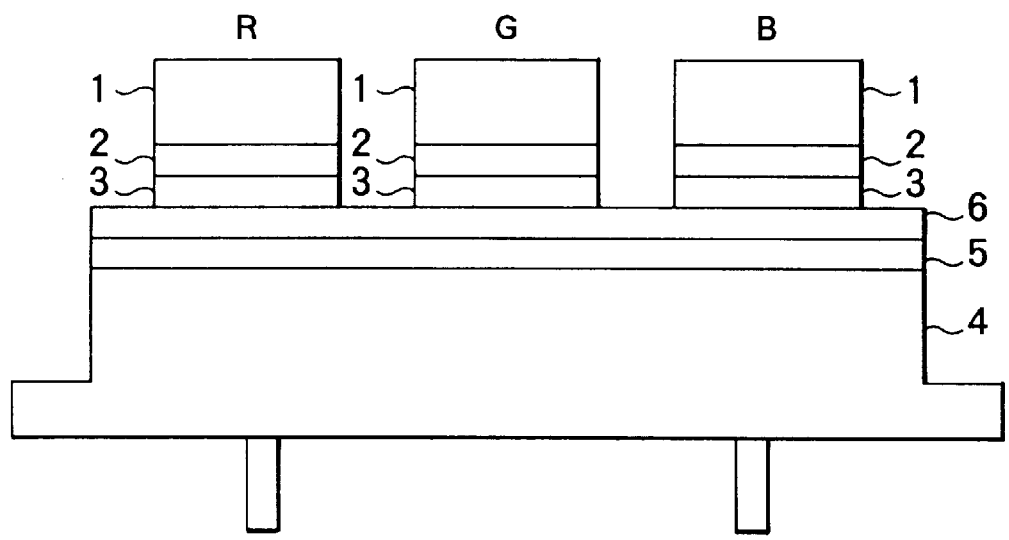
FIG. 5 is a side view showing the next step to what is shown in FIG. 4.
Figure 6:
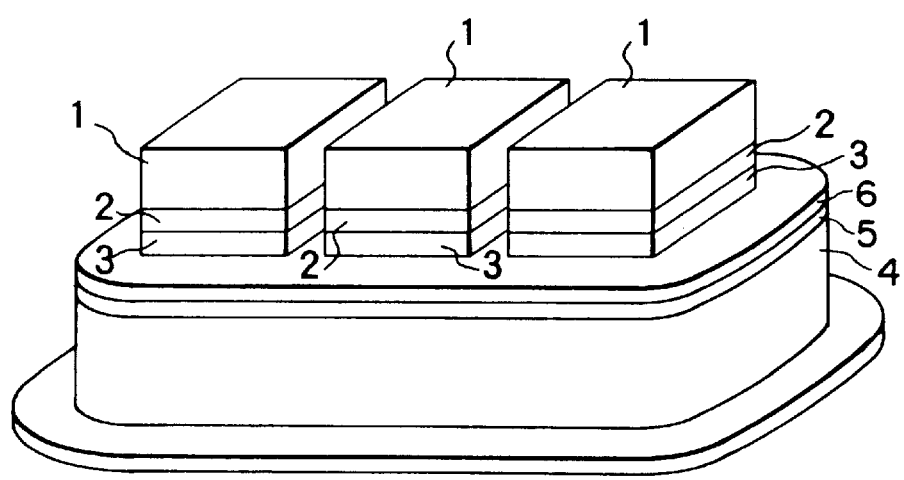
FIG. 6 is a perspective view of the CRT which uses the package according to one embodiment of this invention.

With those points taken into consideration, one embodiment of this invention will be specifically discussed below by referring to the accompanying drawings. FIGS. 3 through 5 are side views illustrating a step-by-step method of manufacturing a CRT which uses a package according to this embodiment of the invention. FIG. 6 is a perspective view of the CRT which uses the package according to one embodiment of this invention.

As shown in FIG. 3, first, a barrier layer 2 is formed by vapor deposition or sputtering at the back of each of field discharge type electron sources (Si substrate having predetermined circuits) 1 associated with the individual colors of R, G and B. Next, a first Au layer 3 is formed on the surface of the barrier layer 2 by vapor deposition or sputtering. The barrier layer 2 is formed of a metal which prevents mutual diffusion of Si in the substrate of the field discharge type electron source 1 with Au in the first Au layer 3 even at a high temperature of 600° C. or higher, e.g., one of Mo, W and Cr. The metal of the barrier layer 2 should preferably have a purity of 99.9% by weight or higher, more preferably a purity of 99.99% by weight or higher.

In the step of forming a package substrate, first, the surface of a base 4 is plated with nickel to form a nickel-based metal coated layer 5, as shown in FIG. 4. This base 4 may be formed of any one of ceramics, KOVAR and iron-nickel alloy. Then, the surface of this metal coated layer 5 is plated with Au to form a second Au layer 6. The metal coated layer 5 is formed to enhance adhesion between the second Au layer 6 and the base 4 and also serves to prevent diffusion of Au in the Au layer into the base 4. Although the metal coated layer is formed of nickel in this embodiment, it may be formed of Cr.

Next, as shown in FIGS. 5 and 6, the three field discharge type electron sources 1 associated with R, G and B are arranged on the package substrate in such a manner that the first Au layer 3 contacts the second Au layer 6, and are scrubbed against the package substrate under this condition. As a result, the first Au layer 3 and the second Au layer 6 form Au—Au eutectic layer by which the individual field discharge type electron sources 1 associated with R, G and B are connected to the package substrate. Therefore, as the first Au layer and the second Au layer form Au—Au eutectic layer, the resultant structure appears to have a single Au layer. Although the second Au layer 6 is formed on the entire top surface of the metal coated layer 5 in this embodiment, the second Au layer may be selectively formed only on the area where each semiconductor device is to be mounted.

There are several scrubbing methods including an ultrasonic scrubbing method and a pressure scrubbing method. As mentioned earlier, the ultrasonic scrubbing method applies a load of several tens to several hundred milligrams to semiconductor devices and also applies ultrasonic waves so that the devices are scrubbed against the package substrate by the ultrasonic vibration with an amplitude of about $\pm 1$ $\mu$m. The pressure scrubbing method applies a load of several hundred to several thousand milligrams to semiconductor devices and mechanically scrubbing the devices against the package substrate.

Because semiconductor devices are mounted on a package substrate by the Au—Au eutectic technique and the ultrasonic scrubbing method or the pressure scrubbing method in this embodiment, positional deviation hardly occurs at the time of connecting them together and a package having a high heat resistance at the junction after connection can be manufactured.

If a field discharge type electron gun is constituted by using the thus manufactured package, which has an excellent heat resistance, no positional deviation occurs even when the package is exposed to a high temperature in the fabrication of a CRT. This is because the barrier layer 2 of Mo, W or Cr, which can prevent mutual diffusion of Au in Au—Au eutectic layer with Si in the substrate of the semiconductor device (field discharge type electron source 1) even at a high temperature of 600° C. or above, is formed on the back of the substrate of the semiconductor device.

If the barrier metal is formed of Ti as in the conventional package, mutual diffusion of Au with Si at a high temperature of 600° C. or above cannot be prevented, so that an Au—Si eutectic alloy layer is formed. In a high temperature treatment, therefore, the Au—Si eutectic alloy layer is melted, resulting in positional deviation between the semiconductor devices and the package substrate.

Since an Au—Si eutectic layer is neither formed nor melted in the sealing step at a temperature of 400 to 500° C. and the discharging step at a temperature of 400 to 550° C. in this embodiment, a CRT can be fabricated at a high precision.

The description of this embodiment has been given of the case where a plurality of field discharge type electron sources 1 are used as semiconductor devices, and a package substrate on which those field discharge type electron sources 1 are mounted is assembled into a CRT. This invention is not however limited to this particular case, but may be adapted to any package which is demanded of a high heat resistance and which should avoid diffusion of Au into the Si substrate from the viewpoint of the performance of the acquired package.

The following describes the fabrication of a package by mounting semiconductor devices on a package substrate by a mounting method embodying this invention. First, a barrier layer was formed several thousands to several ten thousands$\times 10^{-8}$ cm thick on the back of an Si substrate having predetermined circuits. Next, an Au layer was formed several thousands to several ten thousands$\times 10^{-8}$ cm thick on the barrier layer. Thereafter, the semiconductor devices were mounted on the package substrate by the mounting method embodying this invention and the acquired package was left at a temperature of 550° C. for 30 minutes. As a result, the barrier layer, when formed of whichever metal, Mo, W or Cr, could prevent mutual diffusion of Au in the Au layer with Si in the Si substrate, and no remelting occurred at a high temperature, so that positional deviation between the semiconductor devices and the package substrate could be avoided.

What is claimed is:

1. A package having an Au layer, comprising:
    a package substrate, said package substrate having a base and a metal coated layer selectively formed on a surface of said base;
    at least one semiconductor device to be mounted on a package substrate, said semiconductor device having
        a semiconductor substrate made of Si and
        a barrier layer formed on one surface of said semiconductor substrate; and
    an Au layer, provided between said barrier layer and said metal coated layer, for connecting said semiconductor device to said package substrate,
        said metal coated layer serving to enhance adhesion between said Au layer and said base and to prevent Au in said Au layer from being diffused into said base,
        said barrier layer being in contact with Si and serving to prevent mutual diffusion of Si in said semiconductor substrate with Au in said Au layer at a temperature of 600° C. or higher.

2. The package according to claim 1, wherein said barrier layer is formed of one metal selected from a group consists of Mo, W and Cr.

3. The package according to claim 2, wherein said metal of said barrier layer has a purity of 99.9% by weight or higher.

4. The package according to claim 2, wherein said metal of said barrier layer has a purity of 99.99% by weight or higher.

5. The package according to claim 1, wherein said base is made of one material selected from a group consists of ceramics, an alloy of Fe, Ni and Co and iron-nickel alloy.

6. The package according to claim 1, wherein said metal coated layer is formed of one metal selected from a group consists of Ni and Cr.

7. The package according to claim 1, wherein said semiconductor device constitutes a field discharge type electron source.

8. The package according to claim 7, wherein said package constitutes an electron discharge type electron gun.

9. The package according to claim 8, wherein said electron discharge type electron gun constitutes a cathode ray tube.

* * * * *